July 25, 1967 E. H. HUGENHOLTZ 3,333,209
OSCILLATOR SYSTEM FOR CONTROLLING THE FREQUENCY OF AN OSCILLATOR IN PRE-DETERMINED INCREMENTS
Filed Dec. 21, 1964
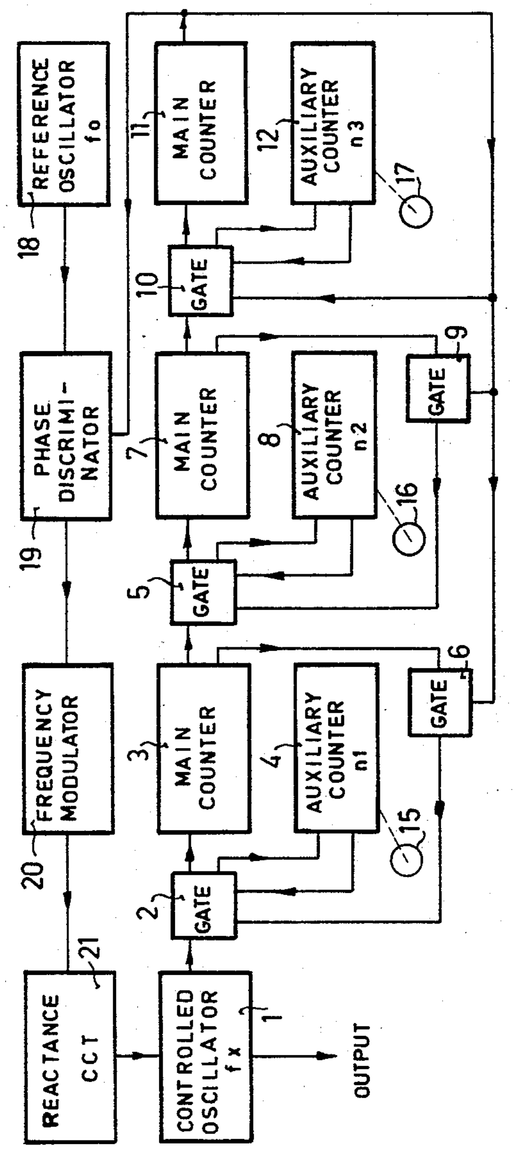
INVENTOR.
EDUARD H. HUGENHOLTZ
BY
Frank R. Jufari
AGENT 3,333,209

OSCILLATOR SYSTEM FOR CONTROLLING THE FREQUENCY OF AN OSCILLATOR IN PREDETERMINED INCREMENTS

Eduard Herman Hugenholtz, Willowdale, Ontario, Canada, assignor to North American Philips Company, Inc., New York, N.Y., a corporation of Delaware Filed Dec. 21, 1964, Ser. No. 419,871
Claims priority, application Canada, Jan. 7, 1964, 892,711
7 Claims. (Cl. 331—25)

ABSTRACT OF THE DISCLOSURE

A frequency control system is described in which the output of the oscillator is applied to a frequency divider, and the output of the divider is compared with reference oscillations in order to produce a control voltage for the oscillator. The frequency divider comprises a plurality of counting stages. Each stage has a main counter with a fixed counting cycle, and an auxiliary counter with an adjustable counting cycle. A selective gate means is provided in each stage to direct input pulses to the auxiliary counter after each output pulse of the divider, and to direct the input pulses to the main counter after the auxiliary counter has counted through a cycle.

The present invention relates to a controlled frequency producing system wherein a high frequency oscillator, for example operating in the 10 megacycle (mcs.) to 50 megacycle range is controllable in steps throughout this range. In addition, when a particular operating frequency in this range is selected, the controlled oscillator is locked at such frequency unless frequency modulation facilities are provided when the selected frequency is the centre frequency of the range of frequencies being swept by the modulated oscillator.

Several oscillator frequency control systems are known but they suffer from the defect that the catching or lock-in range of the controlled oscillator is limited.

In a known system the controlled oscillator output is beat with that of a reference oscillator and the beat output is fed to a tuned frequency discriminator to produce a control voltage which is fed to the oscillator to control the frequency thereof so that the proper beat frequency, that to which the discriminator is tuned, is maintained. In such systems precautions have to be taken to prevent false locking on a frequency on the opposite side of the reference frequency but which still produces the correct frequency beat.

The present invention overcomes the effects of the prior art systems in that a very wide frequency catching or lock-in range is achieved which provides the possibility of controlled wide frequency swing modulation.

A zero beat discriminator is employed so that false-lock-in is prevented.

In accordance with the present invention the controlled oscillator feeds a divider or counter chain to produce a related low frequency output from the counter which is compared, in a phase discriminating device, with a stable reference frequency to produce a control voltage which is applied to the controlled oscillator to maintain a frequency fixed with respect to the reference frequency. Frequency steps are achieved by changing the counting or dividing factor so that the frequency relationship between the reference frequency and the controlled oscillator frequency is changed.

The present invention is particularly concerned with the manner in which the dividing or counting factor is altered to provide for operation of the controlled oscillator at different selected frequencies in a particular range.

In carrying out the invention for each main or fixed counter, several may be employed, an auxiliary counter, the count of which is variable, is provided into which a predetermined number of cycles of output of proceeding oscillator or counter, diverted from the main counter, is fed once for each complete count of the last counter of the chain. As a consequence, the main count is in effect increased by the number of diverted cycles or pulses so that an additional number of cycles of output of the controlled oscillator is required to produce phase lock and hence a higher frequency of operation of the controlled oscillator. The auxiliary counters are therefore employed to increase the frequency of operation of the controlled oscillator with respect to the frequency thereof when no auxiliary counts are employed.

The output cycles or pulses, the latter term which will be used hereinafter, are diverted to an auxiliary counter by means of a two-way main gate circuit, fed by the preceding counter or oscillator. The main gate circuit is pre-set by a conditional circuit in response to the combined output of the main counter and a pulse from the final counter of the chain to divert pulses to an auxiliary counter. The gate is alternately set to feed incoming pulses to the main counter by virtue of the auxiliary counter having reached its predetermined count at which time the auxiliary counter produces an output pulse which is fed to the main gate to cause it to pass the incoming pulses to the next main counter in the chain. The result of this operation is that when the final count output of the chain is maintained at a constant frequency, the controlled oscillator must be increased in operating frequency by the control means to feed the extra number of pulses required to replace those diverted to the auxiliary counter. The number of additional cycles required from the controlled oscillator will vary with the location, in the counting chain, at which the pulses are diverted. By utilizing a number of main and associated auxiliary counter units, it is possible to provide wide and narrow frequency steps in the controlled operating range of the controlled oscillator. In addition, by adding a frequency modulation voltage in series with the oscillator control voltage controlled frequency modulation is achieved.

The invention will now be described with reference to the figure of the drawing which shows a block diagram of a preferred embodiment of the invention.

Referring now to the figure, a controlled oscillator 1 operating in the range of, for example, 10 to 50 megacycles supplies a radio frequency output voltage which may be employed as the local oscillatory voltage in a superhetrodyne receiver. In addition, output voltage from the controlled oscillator is supplied to a frequency dividing or counting chain comprising a plurality of serially connected gates and counters 2, 3, 5, 7, 10 and 11. In the example shown, three auxiliary counters 4, 8 and 12 are employed. Gates 2, 5 and 10 are selectively controlled to supply oscillatory voltage, received from the preceding oscillator or counter, to the main or auxiliary counters. Gates 2 and 5 are under control of conditional gate circuits 6 and 9 respectively while a conditional gate is not used in conjunction with gate 10. Auxiliary counters 4, 8, 12 can be set for counts in range of 0 to 9 by means of controls 15, 16 and 17 respectively.

The output of final counter 11 is fed to conditional gates 6, 9 and auxiliary counter 12. In addition counter 11 output is fed to a phase discriminator 19 to which is also fed the output of a stabilized reference oscillator 18. The resultant voltage from the phase discriminator is fed to a reactance circuit 21, which controls the operating frequency of oscillator 1. A frequency modulator 20 may be inserted in the control line between phase discriminator 19 and reactance circuit 21.

The operation of the circuit is as follows. Oscillator 1 is a high frequency, self-starting oscillator which, as stated earlier, may act as the local oscillator of a superheterodyne receiver. Output voltage from this oscillator is fed to a first gate circuit 2 which we will consider is maintained in a condition to pass the voltage to a 10:1 counter 3. If the frequency of the output of oscillator 1 is $f_x$ then the output of counter 3 will be at a frequency $fx/10$. Considering gates 5 and 10 maintained in a condition to pass the output voltage of counters 3 and 7 to counters 7 and 11 respectively then the output frequency of counter 11 in terms of the local oscillator frequency $f_x$ for the described conditions will be $fx/10^3$. In the operation as described, the auxiliary counters are assumed to be not in operation. In other words, they are set for zero (0) count. The manner in which the auxiliary counters are controlled will be described subsequently.

The output of counter 11 is fed to phase discriminator 19 along with an oscillatory voltage from reference oscillator 18. For the purpose of this explanation, we will consider the output frequency of oscillator 18 to be 10 kilocycles (Kcs.) and if we consider a locked frequency state of operation, i.e. no control voltage applied to reactance circuit 21, then the output of counter 11 must also be 10 kcs. in phase with the reference voltage to produce zero discriminator voltage output. The controlled frequency of oscillator 1 is therefore $$10^3\times 10 \text{ kcs.}=10 \text{ mcs.}$$

which is the product of the counting ratio and the reference oscillator frequency. It will be readily apparent that any tendency for oscillator 1 to drift off the controlled frequency will produce a change in the phase of the output voltage of counter 11 and a resultant voltage from discriminator 19 to counteract the frequency drift of oscillator 1. Hence the frequency of operation of oscillator 1 will be maintained at 10 mcs.

The manner in which frequency changes in the output of oscillator 1 can be obtained will now be described. Auxiliary counter 4 will now be considered to be set to count a predetermined number of pulses or cycles of output from oscillator 1 when gate 2 is set to feed the output voltage to the auxiliary counter.

The output of gate 2, as stated earlier can be selectively fed to main counter 3 or auxiliary counter 4. Gate 2 is set by an output pulse from conditional gate 6 to pass the output of oscillator 1 to auxiliary counter 4. Conditional gate 6 is responsive to the sum of or the coincidence of a pulse received from counter 3 and a pulse from counter 11 to produce the output pulse which is fed to gate 2. An output pulse from auxiliary counter 4 at the end of its pre-set count is fed to gate 2 to reset it to pass the oscillator voltage directly to counter 3. In the zero count position of any of the auxiliary counters the associated gate 2, 5 or 10 is maintained in the condition to feed pulses directly to the next counter.

Assume now that auxiliary counter 4 is set to count one pulse and all other auxiliary counters are set at 0. It is also assumed that the oscillator and counting chain are in operation. An output pulse from counter 3, in conjunction with one from counter 11, will cause conditional gate 6 to produce an output voltage to set gate 2 to feed the oscillator output voltage to auxiliary counter 4, which counter, after receiving one cycle from oscillator 1, produces an output- or reset-pulse which sets gate 2 to pass the following cycles or pulses of output from oscillator 1 to counter 3. Gate 2 will remain in this condition until a further pulse is received from counter 11 in conjunction with one from counter 3.

For the condition of operation described one cycle or pulse of the output of oscillator 1 is diverted from the main counter chain to auxiliary counter 4 for each pulse from counter 11. Since the output frequency of counter 11 must be 10 kcs. to provide phase lock then the frequency of oscillator 1 must be such as to produce one extra cycle of oscillation at the rate of 10 kcs. Hence the output frequency of oscillator 1 must be $$10^3\times 10\times 10^3+10^3 \text{ or } 10.01 \text{ mcs.}$$

It will now be apparent that for each count of auxiliary counter 4 the frequency of oscillator 1 must be increased by 10 kcs. to produce frequency locked operation. Thus auxiliary counter 4 provides means for changing the frequency in 10 kcs. steps with 9 steps being provided, i.e. a total difference of 90 kcs. in operation being obtainable by auxiliary counter 4 alone.

For small frequency steps the phase difference between the reference oscillations and the output of counter 11 will provide sufficient discriminator output voltage to maintain the selected oscillator frequency. For larger steps the frequency of the controlled oscillator is brought near the required value as, for instance, by a voltage supplied to a voltage sensitive capacitor associated with the controlled oscillator tuning circuit.

If we now consider auxiliary counter 8 being set for a count of 1 and auxiliary counters 4 and 12 being set for zero count, then since the operation of the circuitry is similar to that described with reference to counter 4, 11 pulses must be produced by counter 3 for each output pulse from counter 7 and again the extra pulse is produced, under control of counter 11 at 10 kcs. Since each output pulse of counter 3 represents 10 cycles of output of oscillator 1 then the oscillator voltage, to maintain phase lock, must be increased by 10×10 kcs. or 100 kcs. Counter 7 in conjunction with auxiliary counter 8, therefore, provides the facility for obtaining 100 kcs. steps in the frequency of operation of oscillator 1.

Similarly, counter 11 in conjunction with auxiliary counter 12 provides for one megacycle steps. In this instance, no conditional gate is used. The purpose of the conditional gate circuits 6, 9, is to provide that the change-over of the gates 2, 5 respectively will coincide with an output pulse from the associated main counter so that the gate is set to direct the next arriving pulse to the proper counter. This eliminates the possibility of a pulse being fed to the wrong counter during switch over wherein the pulse from the final counter 11 may be long in comparison to the period of the pulses being diverted by the gate concerned.

As will now be apparent the frequency of oscillator 1 is controlled in conjunction with the output of the final counter in comparison to the frequency of the reference oscillator and wherein the final counter output frequency is designed to correspond to the frequency $f_o$ of the reference oscillator the controlled frequency of oscillator 1 can be represented by the following formula:

$$10^3f_o+n_1f_o+10n_2f_o+100n_3f_o$$

wherein $n_1$, $n_2$ and $n_3$ are the counts of auxiliary counters 4, 8 and 12 and counters 3, 7 and 11 are 10:1 counters. Thus counters 3, 4 provide 10 kcs. steps, counters 7, 8 provide 100 kcs. steps and counters 11, 12 provide megacycle steps.

Insofar as circuitry is concerned, the main and auxiliary counters may be conventional but capacitor storage type counters are preferred. It is not a requisite of this invention that 10:1 counters be employed but the counters must be capable of stable operation at the frequencies at which they are required to operate in the circuit.

The gate circuits 2, 5 and 10 may employ biased diode switching with the biases under control of the auxiliary counter and conditional gate circuits.

The conditional gate circuits may take the form of one shot blocking oscillator with storage means to store the output pulse from the final counter 11 to coincide with the arrival of a pulse from the main counter associated with the gate concerned.

Although the invention has been described with reference to a system having three main counters, it should be realized that the number of and the counting or dividing ratio of the counters may be varied to provide for the magnitude and number of frequency steps desired in a particular system.

It will be obvious that no conditional gate is necessary in association with the final counter in the chain since the output of the counter must control the associated gate directly.

The frequency modulator 15, when employed, adds a control voltage, varying with the frequency of the modulation signal, directly to the control voltage from the phase discriminator. During frequency modulation a controlled frequency sweep is automatically provided by the frequency counting control chain.

Although a preferred embodiment of the invention has been described, it will be obvious that various modifications may be made thereto which do not depart from the spirit and scope of the invention as defined in the appended claims.

What is claimed is:

1. In a frequency control system, an oscillator provided with frequency control means, a cascaded series of groups comprising a selective gate means feeding alternately a main counter and an associated auxiliary counter, means utilizing the combined output signal of a main counter and the last main counter of the cascade to produce a signal setting said selective gate means to pass incoming signal to the auxiliary counter associated with that gate, means utilizing the output signal of said auxiliary counter to set said gate associated therewith to pass incoming signals to the main counter of the same group, means applying the output of said oscillator to the selective gate means of the first of said groups, a reference oscillator, means comparing the output counting frequency of the last main counter with the frequency of said reference oscillator to produce a control voltage which is applied to said frequency control means to maintain equality of frequency between the output count of said last main counter and said reference oscillator.

2. The system as claimed in claim 1 wherein the count of said auxiliary counter may be adjusted.

3. In a frequency control system, an oscillator provided with frequency control means, a cascaded series of groups comprising a gate selectively feeding a main and an associated auxiliary counter, means connecting the said auxiliary counter to supply an output signal, after a predetermined count, to said gate to set it to pass incoming signal to said main counter, a signal combining means associated with at least one of said groups, means feeding the output of the last main counter and the output of the main counter associated with said combining means to said combining means, means applying the output of said oscillator to the selective gate means of the first of said groups, to produce a resultant signal, means feeding said resultant signal to said gate means to set it to pass incoming signals to said auxiliary counter, a reference oscillator, means feeding the output signal from said last main counter and from said reference oscillator to a phase discriminator, and means feeding the resultant output voltage of said phase discriminator to said frequency control means to maintain equality between frequencies of the outputs from said reference oscillator and said last main counter.

4. The system as claimed in claim 3 wherein the counts of said main counters are fixed and that of said auxiliary counters are variable.

5. A frequency control system comprising an oscillator having frequency control means, frequency dividing means for dividing the output of said oscillator, a reference oscillator, means for comparing the outputs of said frequency dividing means and reference oscillator to produce a control signal, and means applying said control signal to said frequency control means for controlling the frequency of said first mentioned oscillator, said frequency dividing means comprising a plurality of cascade connected counting stages, each said stage comprising a first counter having a fixed counting cycle, a second counter having an adjustable counting cycle, selective gate means connected to have a first stable state in which input signals are applied to said first counter and a second stable state in which input signals are applied to said second counter, means applying the output of said second counter to said selective gate means for setting said gate means to said first stable state, and means responsive to an output pulse from said dividing means for setting the selective gate means of each counting stage to its second stable state.

6. A frequency control system comprising an oscillator having frequency control means, frequency dividing means for dividing the output of said oscillator, a reference oscillator, means for comparing the outputs of said frequency dividing means and reference oscillator to produce a control signal, and means applying said control signal to said frequency control means for controlling the frequency of said first mentioned oscillator, said frequency dividing means comprising a plurality of cascade connected counting stages, each said stage comprising a first counter having a fixed counting cycle, a second counter having an adjustable counting cycle, selective gate means connected to have a first stable state in which input signals are applied to said first counter and a second stable state in which input signals are applied to said second counter, means applying the output of said second counter to said selective gate means for setting said gate means to said first stable state, all of said stages except the last stage further comprising conditional gate means responsive to a coincidence between a pulse output of the respective stage and a pulse output of said dividing means for setting the respective selective gate means to its second stable state, said last stage comprising means responsive to an output of said dividing means connected to set the respective selective gate means to its second stable state.

7. An adjustable frequency dividing circuit comprising a plurality of counting stages cascade connected between an input terminal and an output terminal, each of said stages comprising a first counter having a fixed counting cycle, a second counter having an adjustable counting cycle, and a gate circuit, said gate circuit having an input which constitutes the input of the respective stage, first and second output terminals, and first and second control terminals, whereby a pulse applied to said first control terminal directs succeeding pulses at the stage input to said first output terminal and a pulse applied to said second control terminal directs succeeding pulses at the stage input to said second output terminal, means connecting the input of said first counting circuit to said first output terminal, the output of said first counting circuit constituting the output of the respective stage, means connecting the input of said second counting circuit to said second output terminal and the output thereof to said first control terminal, each said stage except the last stage further comprising means responsive to coincidence between an output pulse of the respective stage and an output pulse of the dividing circuit for applying a pulse to the respective second control terminal, and means for connecting the output of said dividing circuit to the second control terminal of the said last stage.

References Cited

UNITED STATES PATENTS 3,165,706 1/1965 Sarratt ---------- 331—25 X

ROY LAKE, *Primary Examiner.*

J. B. MULLINS, *Assistant Examiner.*

UNITED STATES PATENT OFFICE

CERTIFICATE OF CORRECTION

Patent No. 3,333,209 July 25, 1967

Eduard Herman Hugenholtz

It is hereby certified that error appears in the above numbered patent requiring correction and that the said Letters Patent should read as corrected below.

Column 5, lines 54 to 56, strike out "means applying the output of said oscillator to the selective gate means of the first of said groups,"; same column 5, line 59, after ",", first occurrence, insert -- means applying the output of said oscillator to the selective gate means of the first of said groups, --.

Signed and sealed this 10th day of September 1968.

(SEAL)

Attest:

Edward M. Fletcher, Jr.
Attesting Officer

EDWARD J. BRENNER
Commissioner of Patents